United States Patent
Su

(10) Patent No.: US 9,472,759 B1
(45) Date of Patent: Oct. 18, 2016

(54) MANUFACTURING METHOD OF PHASE CHANGE MEMORY

(71) Applicants: Ningbo Advanced Memory Technology Corporation, Ningbo (CN); Being Advanced Memory Taiwan Limited, Hsinchu County (TW)

(72) Inventor: Shui-Chin Su, Hsinchu County (TW)

(73) Assignees: Ningbo Advanced Memory Technology Corporation, Ningbo (CN); Being Advanced Memory Taiwan Limited, Hsinchu County (TW)

( * ) Notice: Subject to any disclaimer, the term of this patent is extended or adjusted under 35 U.S.C. 154(b) by 0 days.

(21) Appl. No.: 14/848,350

(22) Filed: Sep. 9, 2015

(30) Foreign Application Priority Data

Jul. 7, 2015 (CN) .......................... 2015 1 0401165

(51) Int. Cl.
*H01L 45/00* (2006.01)

(52) U.S. Cl.
CPC .......... *H01L 45/1666* (2013.01); *H01L 45/06* (2013.01); *H01L 45/126* (2013.01); *H01L 45/1608* (2013.01); *H01L 45/1691* (2013.01)

(58) Field of Classification Search
CPC . H01L 45/06; H01L 45/126; H01L 45/1286; H01L 45/1608; H01L 45/1666; H01L 45/1675; H01L 45/1691
See application file for complete search history.

(56) References Cited

U.S. PATENT DOCUMENTS

| | | | |
|---|---|---|---|
| 7,985,654 B2 | 7/2011 | Breitwisch et al. | |
| 8,404,514 B2* | 3/2013 | Lee | H01L 27/2427 257/E21.461 |
| 8,728,856 B2* | 5/2014 | Pio | H01L 27/2436 257/246 |
| 2008/0061282 A1* | 3/2008 | Sato | H01L 45/06 257/4 |
| 2008/0179585 A1* | 7/2008 | Hsu | H01L 45/06 257/4 |
| 2011/0073829 A1* | 3/2011 | Park | H01L 45/06 257/4 |
| 2011/0266516 A1* | 11/2011 | Park | H01L 27/2409 257/5 |
| 2013/0285003 A1* | 10/2013 | Van Gerpen | H01L 45/06 257/4 |
| 2015/0028283 A1* | 1/2015 | Redaelli | H01L 45/1608 257/5 |

* cited by examiner

*Primary Examiner* — Stephen W Smoot
(74) *Attorney, Agent, or Firm* — CKC & Partners Co., Ltd.

(57) ABSTRACT

A manufacturing method of a phase change memory includes following steps. A first mask layer is formed on a dielectric layer, and a second mask layer is formed on the first mask layer. Then, the first mask layer and the second mask layer are patterned to expose a side surface of the first mask layer. A portion of the first mask layer is removed from the side surface of the first mask layer to form a columnar protrusion. After removing the second mask layer, a heating material layer is formed to conformally cover sidewalls and an upper surface of the columnar protrusion. The heating material layer on the upper surface of the columnar protrusion is removed, so as to form an annular heater from the heating material layer; and the annular heater surrounds the columnar protrusion.

10 Claims, 10 Drawing Sheets

MANUFACTURING METHOD OF PHASE CHANGE MEMORY

RELATED APPLICATIONS

This application claims priority to Chinese Application Serial Number 201510401165.4, filed Jul. 7, 2015, which is herein incorporated by reference.

BACKGROUND

1. Field of Invention

The present invention relates to a manufacturing method of a phase change memory.

2. Description of Related Art

Electronic products (such as mobile phones, tablet computers and digital cameras) generally include memory devices for storing date. General memory device stores information through the storage nodes on the memory cells. Among them, a phase change memory stores data through the resistance state (for example: high resistance and low resistance) of the memory device. The phase change memory may include a material which is able to be transferred between different phases (for example: crystalline phase and amorphous phase). These different phases make the memory unit have resistance states with different resistance values, so as to represent different values for the storage of date.

During the operation of the phase change memory, currents are applied to increase temperature of the memory unit, and the phase of the material is changed. Generally, there exists larger contact area between a heater and a coupled memory unit in the phase change memory unit, and therefore that increases pores and defects at the contact surface. In addition, the currents need to be increased, since the heating and cooling rate is too slow (which means the transition rate between high resistance and low resistance is not fast enough). However, the traditional technique for manufacturing the heater having small contact area requires accurate alignment mechanism, which makes the process complicate and difficult to be controlled, and thus relatively increases the cost of the phase change memory. Therefore, it is necessary in the industry to develop a novel and efficiency process for manufacturing the phase change memory.

SUMMARY

The present disclosure provides a method of manufacturing a phase change memory, which includes following steps. A first mask layer is formed on a dielectric layer, and a second mask layer is formed on the first mask layer. Then, the first mask layer and the second mask layer are patterned to expose a side surface of the first mask layer. A portion of the first mask layer is removed from the side surface of the first mask layer to form a columnar protrusion. After removing the second mask layer, a heating material layer is formed to conformally cover sidewalls and an upper surface of the columnar protrusion. The heating material layer on the upper surface of the columnar protrusion is removed, so as to form an annular heater from the heating material layer; and the annular heater surrounds the columnar protrusion.

In various embodiments of the present disclosure, the method further includes following steps. The columnar protrusion is removed, and an isolation layer is formed to cover the annular heater. Then, the isolation layer is planarized to expose the annular heater; and a phase change layer is formed on the annular heater.

In various embodiments of the present disclosure, the portion of the first mask layer is removed from the side surface of the first mask layer by a wet etching process.

In various embodiments of the present disclosure, the wet etching process further removes a portion of the second mask layer, and a removal rate of the first mask layer is greater than a removal rate of the second mask layer.

In various embodiments of the present disclosure, a barrier layer is formed to conformally cover the sidewalls and the upper surface of the columnar protrusion before forming the heating material layer conformally covering the sidewalls and the upper surface of the columnar protrusion.

In various embodiments of the present disclosure, the heat material layer and the barrier layer on the upper surface of the columnar protrusion are removed by a dry etching process, and the dry etching process stopping at the columnar protrusion.

The present disclosure further provides a method of manufacturing a phase change memory, which includes following steps. A mask layer is formed on a dielectric layer, and the mask layer is patterned. Then, a portion of the mask layer is isotropically removed to form a columnar protrusion on the dielectric layer, and a heating material layer is formed to conformally cover sidewalls and an upper surface of the columnar protrusion. The heating material layer on the upper surface of the columnar protrusion is removed, so as to form an annular heater from the heating material layer; and the annular heater surrounds the columnar protrusion.

In various embodiments of the present disclosure, the method further includes following steps. The columnar protrusion is removed, and an isolation layer is formed to cover the annular heater. Then, the isolation layer is planarized to expose the annular heater and a phase change layer is formed on the annular heater.

In various embodiments of the present disclosure, the portion of the mask layer is isotropically removed by a wet etching process.

In various embodiments of the present disclosure, the method of stripping the photo-resist layer is by spin coating a solvent on the photo-resist layer to dissolve and remove the photo-resist layer.

In various embodiments of the present disclosure, a barrier layer is formed to conformally cover the sidewalls and the upper surface of the columnar protrusion before forming the heating material layer conformally covering the sidewalls and the upper surface of the columnar protrusion.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
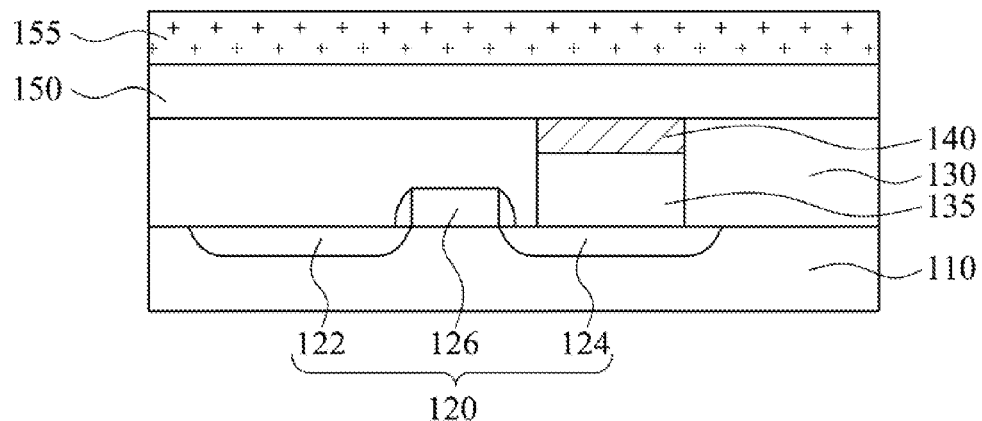
FIG. 1A to FIG. 1I are cross-sectional views of a phase change memory at an intermediate stage of the manufacturing, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1A to FIG. 1I, FIG. 1A to FIG. 1I are cross-sectional views of a phase change memory at an intermediate stage of the manufacturing, according to various embodiments of the present disclosure. Referring first to FIG. 1A, FIG. 1A illustrates steps of forming a first mask layer 150 on a dielectric layer 130 and forming a second mask layer 155 on the first mask layer 150. It is worth noting that the dielectric layer 130 described herein is located on a substrate 110, which includes an active device 120. In this embodiment, the active device 120 is a transistor including a source 122, a drain 124 and a gate 126, which the source 122 and the drain 124 are in doped regions of the substrate 110, and the gate 126 is on the substrate 110 and between the source 122 and the drain 124. In some embodiments, the substrate is formed of silicon or other semiconductor elements, such as germanium or group III-V compounds, but not limited thereto.

Specifically, oxides or nitrides are deposited on the substrate 110 by any suitable methods, so as to form the dielectric layer 130 covering the substrate 110 and the active device 120. Then, the dielectric layer 130 is patterned by photolithography etching to form a through hole through the dielectric layer 130 and to expose the active device 120. Conductive materials (e.q. metal) are filled in the through hole to form a conductive contact 135 connecting to the active device 120. In this embodiment, the active device 120 is a transistor, and the conductive contact 135 is in contact with the drain 124 of the active device 120. After forming the conductive contact 135, a bottom electrode 140 is formed on the conductive contact 135 in the through hole. In some embodiments, the bottom electrode 140 is formed of titanium (Ti), tantalum nitride (TaN), titanium aluminium nitride (TiAlN) or titanium aluminium nitride (TaAlN).

After forming the dielectric layer 130, the conductive contact 135 and the bottom electrode 140, a surface of the dielectric layer 130 may be planarized, and the first mask layer 150 and the second mask layer 155 are formed on the dielectric layer 130 sequentially. In some embodiments, the first mask layer 150 and the second mask layer 155 are formed by any suitable methods, for example, chemical vapor deposition (CVD), physical vapor deposition (PVD) and/or atomic layer deposition (ALD).

Figure 1B:
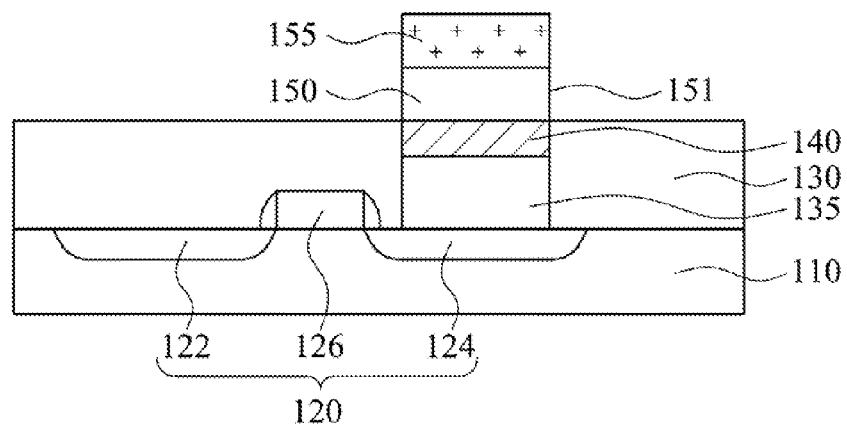

Referring to FIG. 1B, FIG. 1B illustrates a step of patterning the first mask layer 150 and the second mask layer 155 to expose a side surface 151 of the first mask layer 150. For example, a photoresist layer (not shown) is spin-coated on the second mask layer 155, and an exposure technique is applied to transfer a pattern of a mask (not shown) to the photoresist layer, so as to expose an upper surface of the second mask layer 155. Then, a wet etching process or a dry etching process is applied to remove a portion of the first mask layer 150 and a portion of the second mask layer 155, and the step of patterning the first mask layer 150 and the second mask layer 155 is finished. The patterned first mask layer 150 and the patterned second mask layer 155 are substantially on the bottom electrode 140, and the patterned first mask layer 150 is in contact with the bottom electrode 140. In addition, the patterning process further exposes the side surface 151 of the first mask layer 150.

Figure 1C:
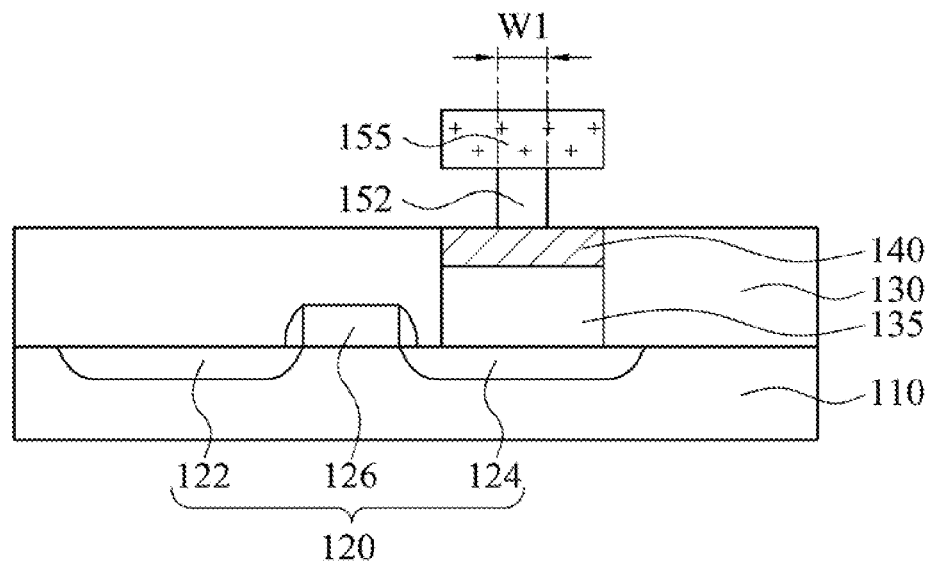

Continuing in FIG. 1C, FIG. 1C illustrates a step of removing a portion of the first mask layer 150 from the side surface 151 of the first mask layer 150 to form a columnar protrusion 152. In this step, a wet etching process is applied to laterally etch the exposed side surface 151 of the first mask layer 150, and an upper surface of the first mask layer 150 is protected by the second mask layer 155 to prevent erosion during the wet etching process. It is worth noting that the wet etching process simultaneously removes a portion of the second mask layer 155, so an appropriate etchant is chosen in order to make a removal rate of the first mask layer 150 greater than a removal rate of the second mask layer 155. In other words, the chosen etchant has higher etching selectivity to the first mask layer 150. In one embodiment, the first mask layer 150 is formed of polysilicon, and the second mask layer 155 is formed of silicon nitride. Hence, tetramethylammonium hydroxide (TMAH) solution, aqueous ammonia (NH$_4$OH), and/or other suitable etchants having higher etching selectivity to the polysilicon may be applied to remove the first mask layer 150, and without unduly removing the second mask layer 155.

As shown in FIG. 1C, the columnar protrusion 152 formed from the first mask layer 150 by the wet etching process has a cross-sectional width W1, and the columnar protrusion 152 exposes a portion of the bottom electrode 140. Because the cross-sectional width W1 will determine a contact area between a heater and a phase change layer formed in the subsequent process, so the dimension of the cross-sectional width W1 is controlled by tuning various parameters, for example, etching time, etchant concentration and/or etchant type, and the details are described in the following. Specifically, the first mask layer 150 substantially has rectangular profile before etching, but right angles of the rectangular profile are removed during lateral etching to form the columnar protrusion 152 having cylindrical profile or elliptical columnar profile. The cross-sectional width W1 may be a diameter of the columnar protrusion 152 having cylindrical profile, or a major axis or a minor axis of the columnar protrusion 152 having elliptical columnar profile.

Figure 1D:
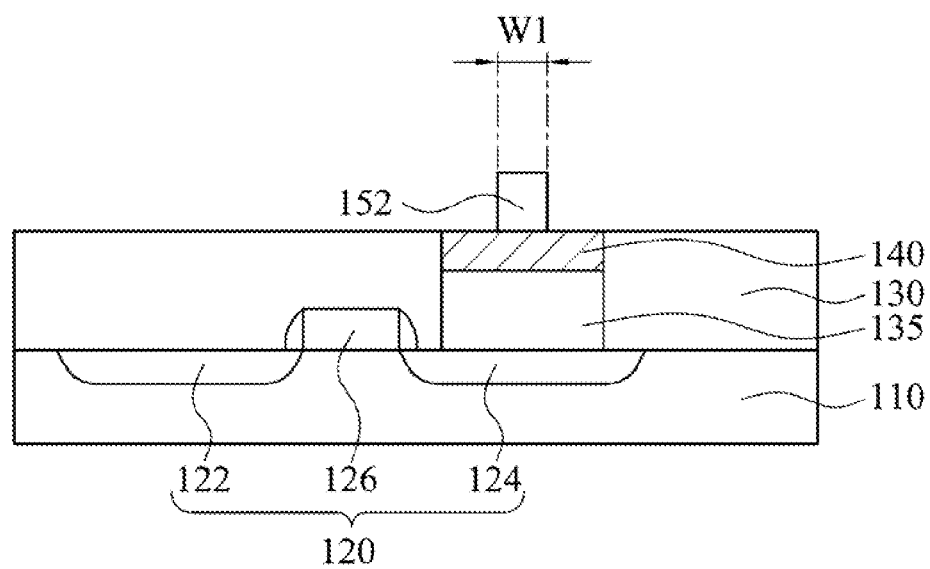

Continuing in FIG. 1D, FIG. 1D illustrates a step of removing the second mask layer 155. In this step, any suitable solvents are applied to strip the second mask layer 155, and to remain the columnar protrusion 152 having the cross-sectional width W1 on the bottom electrode 140. In some embodiments, the second mask layer 155 is formed of silicon nitride, and phosphoric acid and/or fluoric acid may be used to strip the second mask layer 155.

Figure 1E:
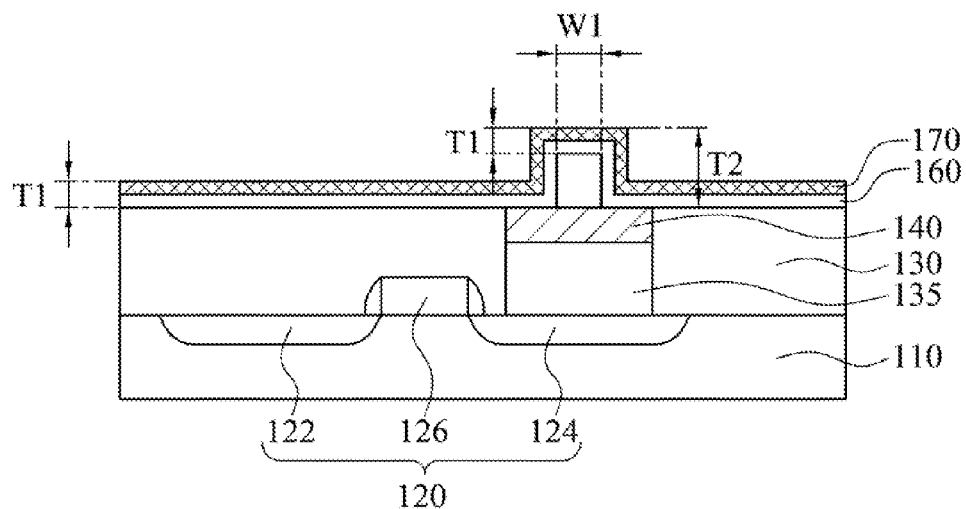

Continuing in FIG. 1E, FIG. 1E illustrates a step of forming a heating material layer 170 conformally covering sidewalls and an upper surface of the columnar protrusion 152. A material of the heating material layer 170 includes titanium nitride. It is worth noting that a barrier layer 160 is formed to conformally covering the sidewalls and the upper surface of the columnar protrusion 152 before forming the heating material layer 170 conformally covering the sidewalls and the upper surface of the columnar protrusion 152. A material of the barrier layer 160 has lower thermal conductivity, so as to enhance electrical property of the manufactured phase change memory. In some embodiments, the material of the barrier layer 160 may include tantalum nitride, but in various embodiments, the barrier layer 160 may be omitted without affecting the spirits of the present disclosure.

Specifically, the barrier layer 160 conformally covers an upper surface of the dielectric layer 130 and the sidewalls and the upper surface of the columnar protrusion 152. In addition, the barrier layer 160 is further in contact with a portion of the exposed bottom electrode 140. Then, the heat material layer 170 is formed conformally on the barrier layer 160. As shown in FIG. 1E, the barrier layer 160 and the heat material layer 170 jointly form a thickness T1 on the dielectric layer 130 and the upper surface of the columnar protrusion 152. Also, the barrier layer 160 and the heat material layer 170 jointly form a thickness T2 at the sidewalls of the columnar protrusion 152, and the thickness T2 is greater than thickness T1. It must be noted that the thickness T1 and the thickness T2 are the thickness vertical to the dielectric layer 130. In some embodiments, the barrier layer 160 and the heat material layer 170 are formed by chemical vapor deposition, physical vapor deposition, atomic layer deposition and/or thermal oxidation in order to achieve excellent step coverage, so as to form the barrier layer 160 and the heat material layer 170 uniformly covering the sidewalls of the columnar protrusion 152.

Figure 1F:
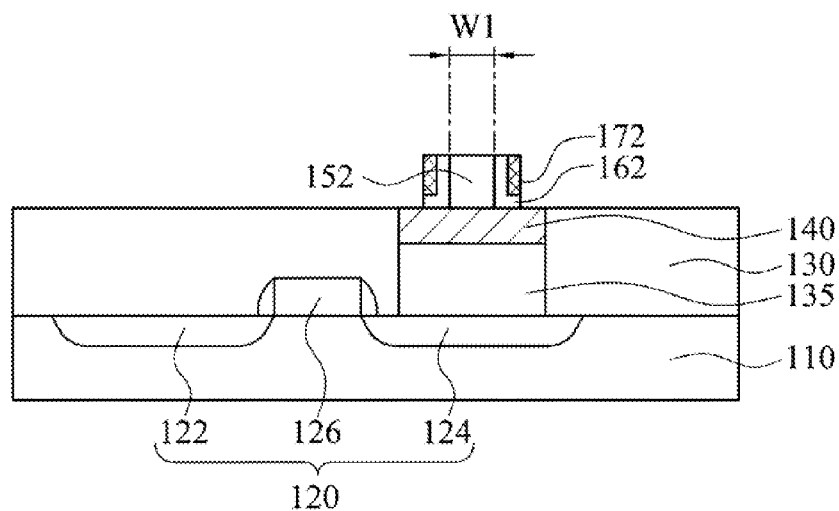

Referring to FIG. 1F, FIG. 1F illustrates a step of removing the heating material layer 170 on the upper surface of the columnar protrusion 152 to form an annular heater 172 from the heating material layer 170, whereby the annular heater 172 surrounds the columnar protrusion 152. In this step, a dry etching process is applied to anisotropically decrease the thickness of the barrier layer 160 and the heat material layer 170 to remove the barrier layer 160 and the heat material layer 170 on the upper surface of the columnar protrusion 152 and the dielectric layer 130, wherein the thickness is vertical to the dielectric layer 130. The dry etching process stops at an upper surface of the columnar protrusion 152 to expose the columnar protrusion 152. However, since the barrier layer 160 and the heat material layer 170 at the sidewalls of the columnar protrusion 152 jointly form the greater thickness T2, they are not completely removed by the dry etching process and remained on the dielectric layer 130 to surround the columnar protrusion 152. In other words, the dry etching process removes the heat material layer 170 on the upper surface of the columnar protrusion 152 but remains the annular heater 172 at the sidewalls of the columnar protrusion 152. Similarly, the dry etching process removes the barrier layer 160 on the upper surface of the columnar protrusion 152 but remains the annular barrier 162 at the sidewalls of the columnar protrusion 152. As aforementioned, the columnar protrusion 152 has cylindrical profile or elliptical columnar profile, so the annular barrier 162 and the annular heater 172 remained on sidewalls of the columnar protrusion 152 are of annular cylinder structure. Furthermore, as shown in FIG. 1F, the annular heater 172 is on the annular barrier 162 and surrounds the annular barrier 162. Specifically, the cross-sectional view of the annular barrier 162 is a stepped profile, and the annular heater 172 extends vertically from a lower surface of the stepped profile to a level which is coplanar with the upper surface of the stepped profile.

In some embodiment, an etching gas applied in the dry etching process may include sulfur hexafluoride, helium, carbon tetrafluoride, trifluoromethane, hydrogen bromide, chlorine, oxygen, nitrogen, or a combination thereof, but not limited thereto.

Figure 1G:
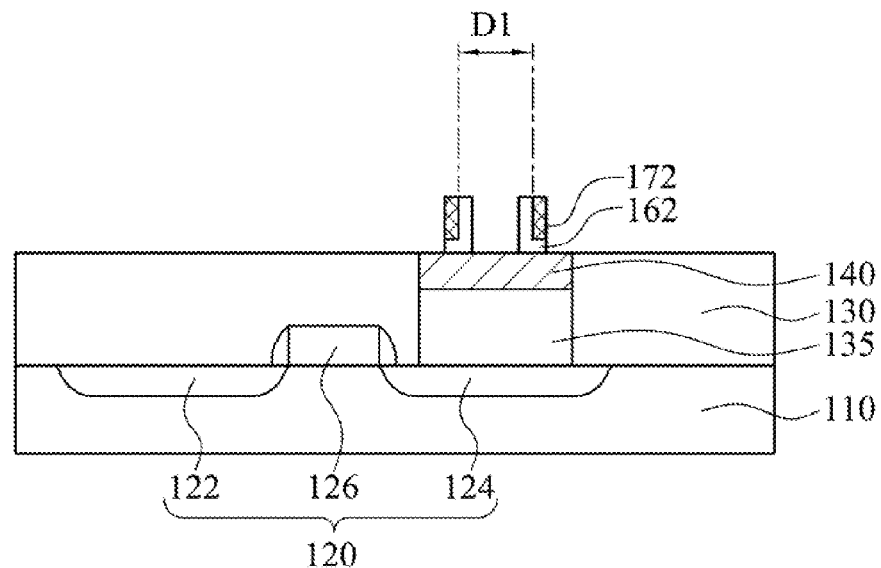

Continuing in FIG. 1G, FIG. 1G illustrates a step of removing the columnar protrusion 152. After forming the annular heater 172 and the annular barrier 162, the columnar protrusion 152 may be removed by any suitable solvents. In some embodiments, the columnar protrusion 152 is formed of polysilicon, and tetramethylammonium hydroxide (TMAH) solution and/or aqueous ammonia ($NH_4OH$) is suitable to strip the columnar protrusion 152. It is worth noting that an inner diameter D1 of the annular heater 172 is slightly larger than the cross-sectional width W1 of the columnar protrusion 152. As aforementioned, the dimension of the cross-sectional width W1 is controlled by tuning various parameters, for example, etching time, etchant concentration and/or etchant type, and the cross-sectional width W1 is used to define a dimension of the inner diameter D1. Specifically, greater cross-sectional width W1 enlarges a distance between the heat material layer 170 at the sidewalls of the columnar protrusion 152, so as to form the annular heater 172 which has the greater inner diameter D1. Otherwise, the annular heater 172 has the smaller inner diameter D1 if the cross-sectional width W1 is smaller. The dimension of the inner diameter D1 is related to the contact area between the annular heater 172 and the phase change layer, and the details are described in the following. In some embodiments, the step of forming the barrier layer 160 may be omitted, and the inner diameter D1 of the annular heater 172 is substantially equal to the cross-sectional width W1 of the columnar protrusion 152.

Figure 1H:
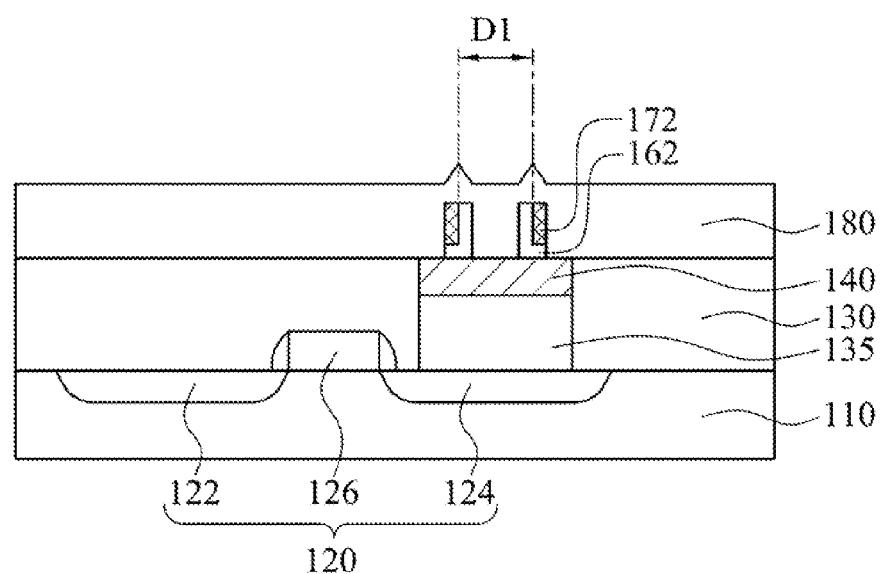

Referring to FIG. 1H, FIG. 1H illustrates a step of forming an isolation layer 180 covering the annular heater 172. In this step, the isolation layer 180 may be formed by the chemical vapor deposition, physical vapor deposition, or atomic layer deposition to cover the annular heater 172, the annular barrier 162 and the dielectric layer 130. As shown in FIG. 1H, an upper surface of the formed isolation layer 180 is not flat, so the isolation layer 180 is further planarized. For example, a chemical mechanical polishing (CMP) process is applied to planarize the upper surface of the isolation layer 180, and the CMP process stops at an upper surface of the annular heater 172 to expose the annular heater 172. In some embodiments, the isolation layer 180 is formed of silicon oxide, silicon nitride, silicon oxynitride, and/or a combination thereof.

Figure 1I:
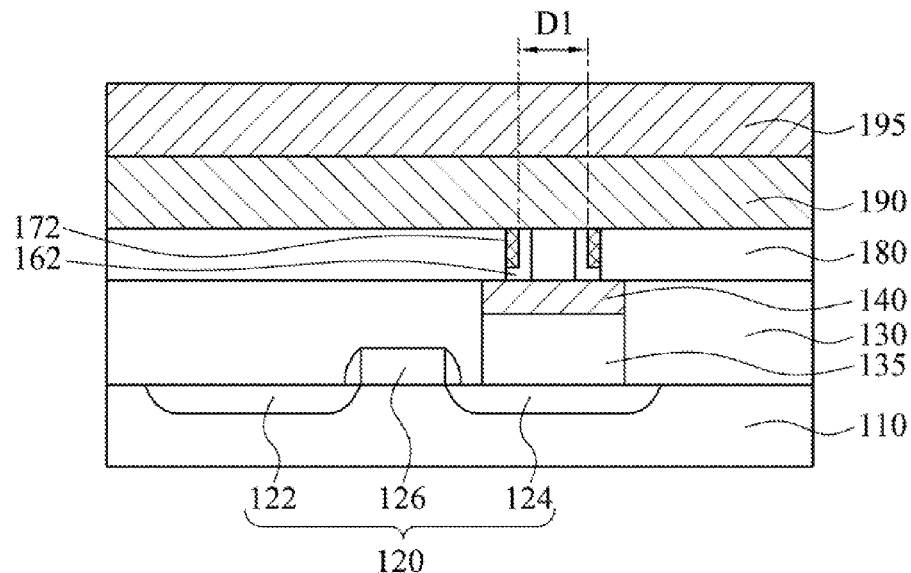

Referring to FIG. 1I, FIG. 1I illustrates a step of forming a phase change layer 190 on the annular heater 172 and a step of forming a top electrode 195 on the phase change layer 190 to accomplish the manufacture of the phase change memory 100. After planarizing the isolation layer 180 to expose the annular heater 172, the phase change layer 190 is formed on the annular heater 172 and in contact with the annular heater 172. Specifically, currents generated by the active device 120 pass through the conductive contact 135, bottom electrode 140, annular barrier 162 and the annular heater 172, and enter the phase change layer 190 from the contact area between the annular heater 172 and the phase change layer 190. Owing to ohmic heating, the phase change layer 190 is heated and/or cooled and transferred between a crystallization phase and an amorphous phase. It is worth noting that the smaller contact area between the annular heater 172 and the phase change layer 190 allows higher current density, so as to enhance the heating efficiency. In other words, short and strong electrical pulse passes through the annular heater 172 and generates high current density to accelerate the cooling and heating rate of the phase change layer 190, and thus enhances the transition speed between the crystallization phase and the amorphous phase.

Figure 3:
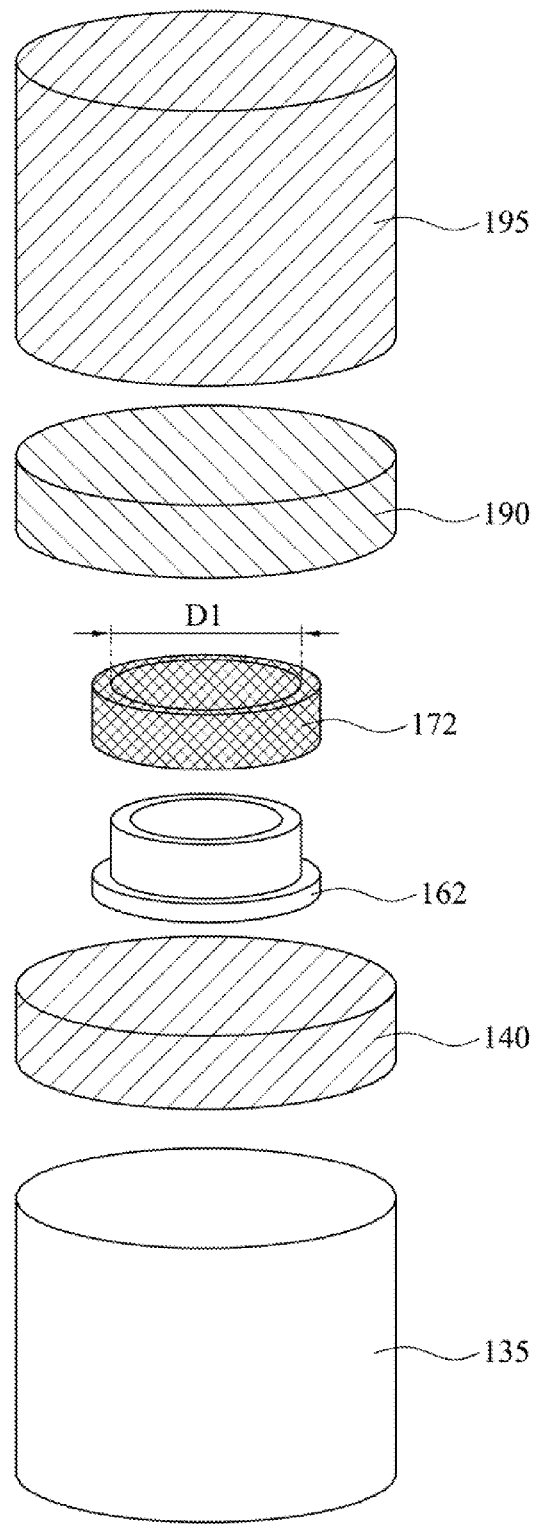
FIG. 3 is an explosion diagram of the phase change memory shown in FIG. 1I, according to various embodiments of the present disclosure.

Referring to FIG. 3 at the same time, FIG. 3 is an explosion diagram of the phase change memory 100 in FIG. 1I. The substrate 110, the active device 120, the dielectric layer 130 and the conductive contact 135 are omitted in FIG. 3 to clearly describe the present disclosure. Specifically, the active device 120 provides the currents to the bottom electrode 140, and the currents sequentially pass through bottom electrode 140, annular barrier 162, annular heater 172 and phase change layer 190 to enter the top electrode 195. Higher current density is achieved if the contact area between the annular heater 172 and the phase change layer 190 is smaller, and thus increases the heating efficiency of the annular heater 172. As illustrated in the present disclosure, the annular heater 172 is of the annular cylinder structure, and the smaller inner diameter D1 of the annular cylinder structure decreases the contact area between the annular cylinder structure and the phase change layer 190. It is known that the contact area between the phase change layer 190 and the annular heater 172 is relatively decreased when the annular heater 172 has the smaller inner diameter D1, and thus increases the efficiency of the manufactured phase change memory 100. Therefore, etching time, etchant concentration and/or etchant type are tuned in the wet etching process to make the columnar protrusion 152 have the smaller cross-sectional width W1. As aforementioned, the cross-sectional width W1 is used to define the dimension of the inner diameter D1, wherein the dimension of the inner diameter D1 and the dimension of the cross-sectional width W1 are substantially positive correlation. If decreasing the dimension of the cross-sectional width W1, the inner diameter D1 of the manufactured annular heater 172 is relatively decreased to reduce the contact area between the annular heater 172 and the phase change layer 190, and thus enhances the efficiency of the phase change memory 100. Compared to the prior art, the present disclosure provides a simple and efficient process to obtain the annular heater 172 having smaller dimension, so a complicated and time consumed alignment mechanism is not required. In some embodiments, the annular heater 172 is not limited to annular cylinder structure The annular heater 172 may be of annular rectangular structure, annular wave structure or other suitable annular structure without exceeding the scope of the present disclosure.

Continuing in FIG. 1I. After forming the phase change layer 190, the top electrode 195 is formed on the phase change memory 190 and in contact with the phase change memory 190, so as to form the phase change memory 100. Furthermore, a photolithography etching technique is applied to pattern the phase change memory 190 and the top electrode 195. In some embodiments, the phase change memory 190 may include one or more phase change materials, such as GeSbTe ($Ge_2Sb_2Te_5$, $Ge_3Sb_6Te_5$, GST), nitrogen-doped $Ge_2Sb_2Te_5$, $Sb_2Te$, GeSb or In-doped $Sb_2Te$. In some embodiments, the top electrode 195 is formed of titanium, tantalum nitride, titanium aluminium nitride or titanium aluminium nitride, and the material of the top electrode 195 may be the same as or different from the material of the bottom electrode 140.

Figure 2A:
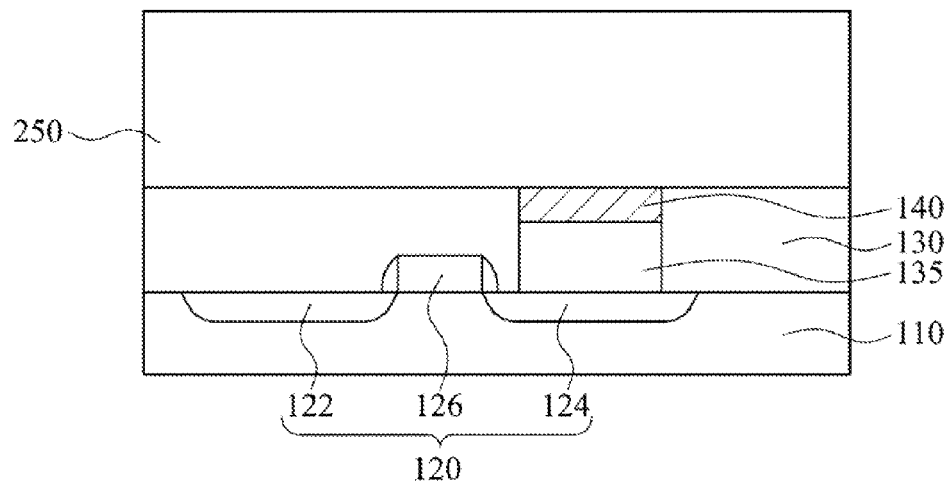
FIG. 2A to FIG. 2H are cross-sectional views of a phase change memory at an intermediate stage of the manufacturing, according to various embodiments of the present disclosure.

Referring to FIG. 2A to FIG. 2H, FIG. 2A to FIG. 2H are cross-sectional views of a phase change memory at intermediate stages of the manufacturing, according to various embodiments of the present disclosure. Referring first to FIG. 2A, FIG. 2A illustrates a step of forming a mask layer 250 on a dielectric layer 130. The substrate 110, source 122, drain 124 and gate 126, dielectric layer 130 and the bottom electrode 140 shown in FIG. 2A are similar to those in FIG. 1A, and the details are not described herein.

After forming the dielectric layer 130, the conductive contact 135 and the bottom electrode 140, a surface of the dielectric layer 130 may be planarized, and the mask layer 250 is formed on the dielectric layer 130. In some embodiments, the mask layer 250 is formed by any suitable methods, for example, chemical vapor deposition, physical vapor deposition and/or atomic layer deposition.

Figure 2B:
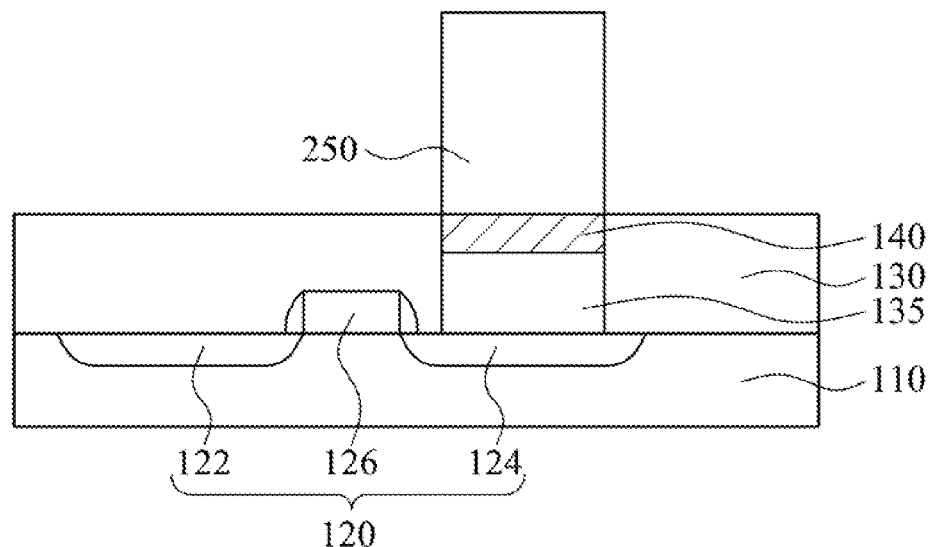

Referring to FIG. 2B, FIG. 2B illustrates a step of patterning the mask layer 250. For example, a photoresist layer (not shown) is spin-coated on the mask layer 250, and an exposure technique is applied to transfer a pattern of a mask (not shown) to the photoresist layer, so as to expose an upper surface of the mask layer 250. Finally, a wet etching process or a dry etching process is applied to remove a portion of the mask layer 250 to accomplish the step of patterning the mask layer 250. The patterned mask layer 250 is substantially on the bottom electrode 140, and the patterned mask layer 250 is in contact with the bottom electrode 140.

Figure 2C:
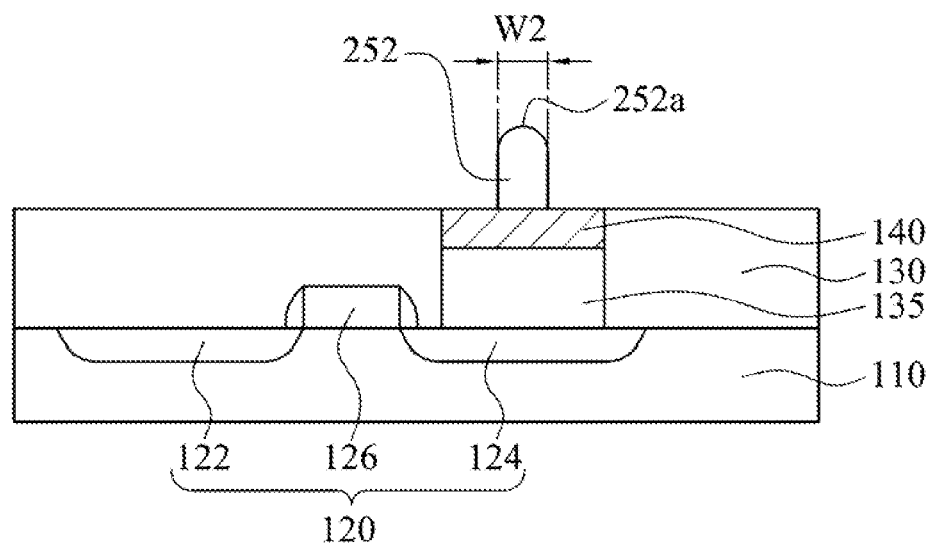

Continuing in FIG. 2C, FIG. 2C illustrates a step of isotropically removing a portion of the mask layer 250 to form a columnar protrusion 252 on the dielectric layer. In this step, a wet etching process is applied to etch every exposed surfaces of the mask layer 250. As shown in FIG. 2C, the columnar protrusion 252 formed from the mask layer 250 by the wet etching process has a cross-sectional width W2, and the columnar protrusion 252 exposes a portion of the bottom electrode 140. Because the cross-sectional width W2 will determine a contact area between a heater and a phase change layer formed in the subsequent process, the dimension of the cross-sectional width W2 is controlled by tuning various parameters, for example, etching time, etchant concentration and/or etchant type, and the details are described in the following. Specifically, the mask layer 250 substantially has rectangular profile before etching, but right angles of the rectangular profile are removed during etching to form the columnar protrusion 252 having cylindrical profile or elliptical columnar profile. The cross-sectional width W2 may be a diameter of the columnar protrusion 252 having cylindrical profile, or a major axis or a minor axis of the columnar protrusion 252 having elliptical columnar profile. It is worth noting that the difference between FIG. 2A to 2H and FIG. 1A to 1I is that an upper surface of the mask layer 250 is etched during the wet etching process, since there is no addition mask layer to protect the upper surface. Therefore, the upper surface 252a of the columnar protrusion 252 is not flat, which has a curved profile shown in FIG. 2C. Although the exemplary upper surface 252 in the present disclosure has the curved profile, but the shape of the profile is determined by various process parameters and not limited to the present disclosure.

In one embodiment, the mask layer 250 is formed of polysilicon, and tetramethylammonium hydroxide (TMAH) solution, aqueous ammonia ($NH_4OH$), and/or other suitable etchants having higher etching selectivity to the mask layer 250 (Compared with materials of the bottom electrode 140 and the dielectric layer 130). The ecthant isotropically removes the portion of the mask layer 250 to form the columnar protrusion 252.

Figure 2D:
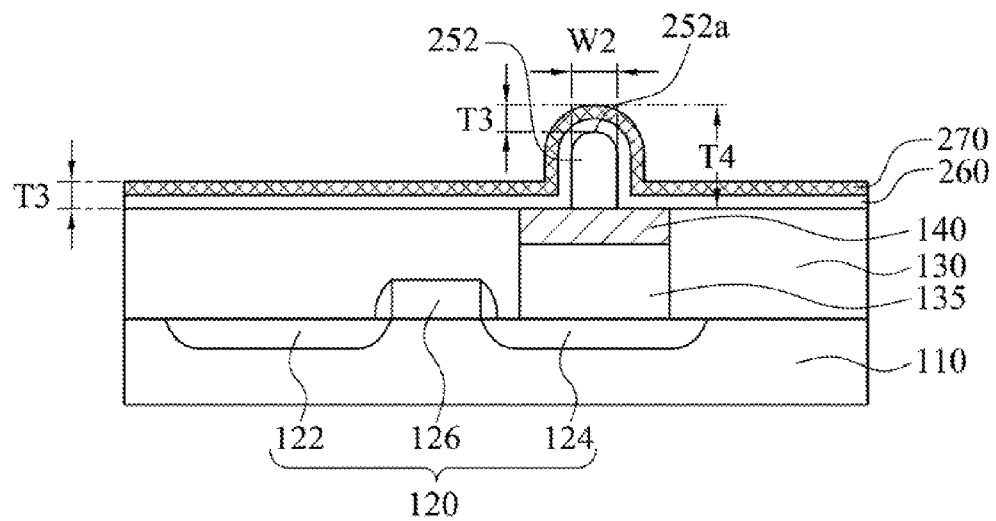

Continuing in FIG. 2D, FIG. 2D illustrates a step of forming a heating material layer 270 conformally covering sidewalls and an upper surface of the columnar protrusion 252. A material of the heating material layer 270 includes titanium nitride. It is worth noting that a barrier layer 260 is formed to conformally cover the sidewalls and the upper surface of the columnar protrusion 252 before forming the heating material layer 270 conformally covering the sidewalls and the upper surface of the columnar protrusion 252. A material of the barrier layer 260 has lower thermal conductivity, so as to enhance electrical property of the manufactured phase change memory. In some embodiments, the material of the barrier layer 260 may include tantalum nitride, but in various embodiments, the barrier layer 260 may be omitted without affecting the spirits of the present disclosure.

Specifically, the barrier layer 260 conformally covers an upper surface of the dielectric layer 130 and the sidewalls and the upper surface 252a of the columnar protrusion 252. In addition, the barrier layer 260 is further in contact with a portion of the exposed bottom electrode 140. Then, the heat material layer 270 is formed conformally on the barrier layer 260. As shown in FIG. 2D, the barrier layer 260 and the heat material layer 270 jointly form a thickness T3 on the dielectric layer 130 and the upper surface 252a of the columnar protrusion 252. Also, the barrier layer 260 and the heat material layer 270 jointly form a thickness T4 at the sidewalls of the columnar protrusion 252, wherein the thickness T4 is greater than the thickness T3. It must be noted that the thickness T3 and the thickness T4 are the thickness vertical to the dielectric layer 130. In some embodiments, the barrier layer 260 and the heat material layer 270 are formed by chemical vapor deposition, physical vapor deposition, atomic layer deposition so as to achieve excellent step coverage and to form the barrier layer 260 and the heat material layer 270 which uniformly cover the sidewalls of the columnar protrusion 252.

Figure 2E:
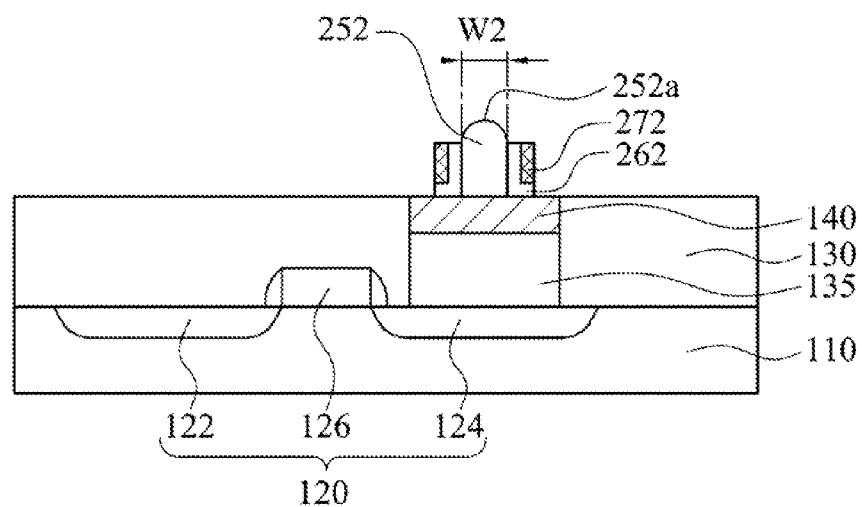

Referring to FIG. 2E, FIG. 2E illustrates a step of removing the heating material layer 270 on the upper surface 252a of the columnar protrusion 252 to form an annular heater 272 from the heating material layer 270, whereby the annular heater 272 surrounds the columnar protrusion 252. In this step, a dry etching process is applied to anisotropically decrease the thickness of the barrier layer 260 and the heat material layer 270 to remove the barrier layer 260 and the heat material layer 270 on the upper surface 252a of the columnar protrusion 252 and the dielectric layer 130, wherein the thickness is vertical to the dielectric layer 130. The dry etching process stops at the upper surface 252a of the columnar protrusion 252 to expose the columnar protrusion 252. However, since the barrier layer 260 and the heat material layer 270 at the sidewalls of the columnar protrusion 252 jointly form the greater thickness T2, they are not completely removed by the dry etching process and remained on the dielectric layer 130 to surround the columnar protrusion 252. In other words, the dry etching process removes the heat material layer 270 on the upper surface 252a of the columnar protrusion 252 but remains the annular heater 272 at the sidewalls of the columnar protrusion 252. Similarly, the dry etching process removes the barrier layer 260 on the upper surface 252a of the columnar protrusion 252 but remains the annular barrier 262 at the sidewalls of the columnar protrusion 252. As aforementioned, the columnar protrusion 252 has cylindrical profile or elliptical columnar profile, so the annular barrier 262 and the annular heater 272 remained on sidewalls of the columnar protrusion 252 are of annular cylinder structure. Furthermore, as shown in FIG. 2E, the annular heater 272 is on the annular barrier 262 and surrounds the annular barrier 262. Specifically, the cross-sectional view of the annular barrier 262 is a stepped profile, and the annular heater 272 extends vertically from a lower surface of the stepped profile to a level which is coplanar with the upper surface of the stepped profile.

In some embodiment, an etching gas applied in the dry etching process may include sulfur hexafluoride, helium, carbon tetrafluoride, trifluoromethane, hydrogen bromide, chlorine, oxygen, nitrogen, or a combination thereof, but not limited thereto.

Figure 2F:
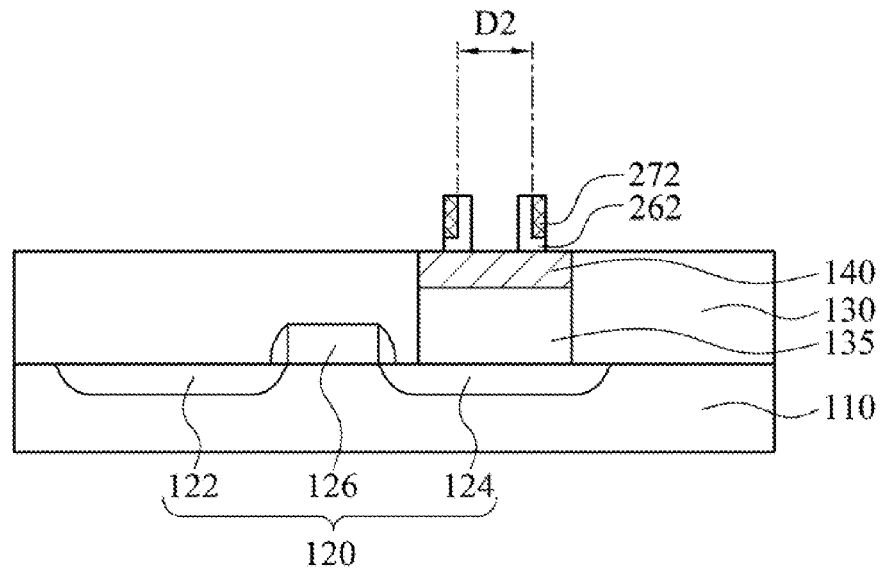

Continuing in FIG. 2F, FIG. 2F illustrates a step of removing the columnar protrusion 252. After forming the annular heater 272 and the annular barrier 262, the columnar protrusion 252 may be removed by any suitable solvents. In some embodiments, the columnar protrusion 252 is formed of polysilicon, and tetramethylammonium hydroxide (TMAH) solution and/or aqueous ammonia ($NH_4OH$) is suitable to strip the columnar protrusion 252. It is worth noting that an inner diameter D2 of the annular heater 272 is slightly larger than the cross-sectional width W2 of the columnar protrusion 252. As aforementioned, the dimension of the cross-sectional width W2 is controlled by tuning various parameters, for example, etching time, etchant concentration and/or etchant type, and the cross-sectional width W2 is used to define a dimension of the inner diameter D2. Specifically, greater cross-sectional width W2 enlarges a distance between the heat material layer 270 at the sidewalls of the columnar protrusion 252, so as to form the annular heater 272 which has the greater inner diameter D2. Otherwise, the annular heater 272 has the smaller inner diameter D2 if the cross-sectional width W2 is smaller. The dimension of the inner diameter D2 is related to the contact area between the annular heater 272 and the phase change layer, and the details are described in the following. In some embodiments, the step of forming the barrier layer 260 may be omitted, and the inner diameter D2 of the annular heater 272 is substantially equal to the cross-sectional width W2 of the columnar protrusion 252.

Figure 2G:
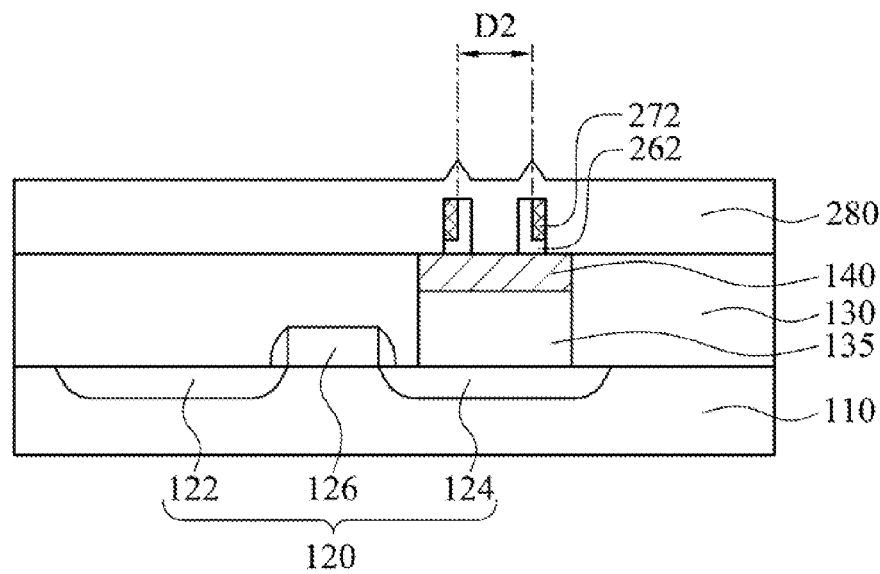

Referring to FIG. 2G, FIG. 2G illustrates a step of forming an isolation layer 280 covering the annular heater 272. In this step, the isolation layer 280 may be formed by the chemical vapor deposition, physical vapor deposition, or atomic layer deposition to cover the annular heater 272, the annular barrier 262 and the dielectric layer 130. As shown in FIG. 2G, an upper surface of the formed isolation layer 280 is not flat, so the isolation layer 280 is further planarized. For example, a chemical mechanical polishing (CMP) process is applied to planarize the upper surface of the isolation layer 280, and the CMP process stops at an upper surface of the annular heater 272 to expose the annular heater 272. In some embodiments, the isolation layer 280 is formed of silicon oxide, silicon nitride, silicon oxynitride, and/or a combination thereof.

Figure 2H:
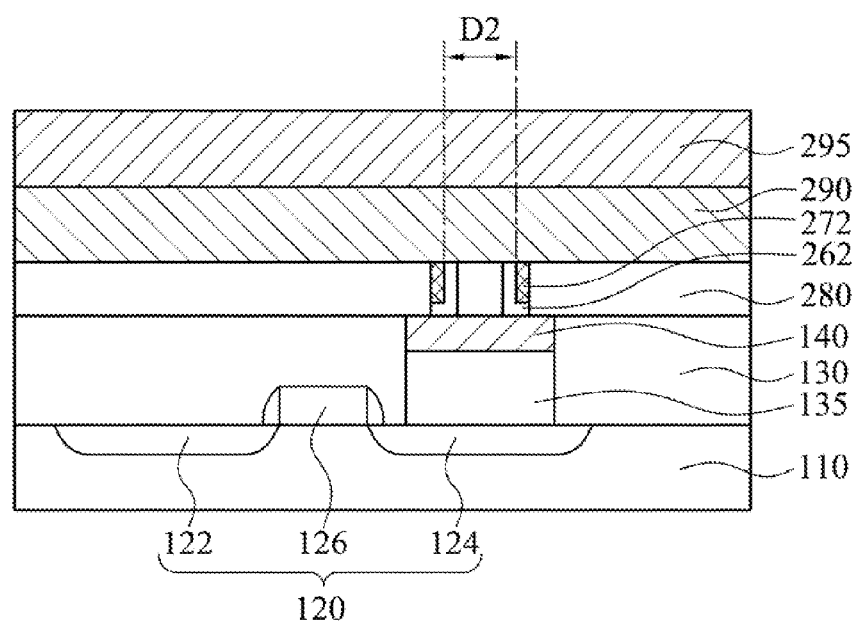

Referring to FIG. 2H, FIG. 2H illustrates a step of forming a phase change layer 290 on the annular heater 272 and a step of forming a top electrode 295 on the phase change layer 290. In addition, a photolithography etching technique is applied to pattern the phase change memory 290 and the top electrode 295 to accomplish the manufacture of the phase change memory 200. After planarizing the isolation layer 280 to expose the annular heater 272, the phase change layer 290 is formed on the annular heater 272 and in contact with the annular heater 272. As aforementioned, the smaller contact area between the annular heater 272 and the phase change layer 290 allows higher current density, so as to enhance the heating efficiency. It is known that the contact area between the phase change layer 290 and the annular heater 272 is relatively decreased when the annular heater 272 has the smaller inner diameter D2, and thus increases the efficiency of the manufactured phase change memory 200. Therefore, etching time, etchant concentration and/or etchant type are tuned in the wet etching process to make the columnar protrusion 252 have the smaller cross-sectional width W2. If decreasing the dimension of the cross-sectional width W2, the inner diameter D2 of the manufactured annular heater 272 is relatively decreased to reduce the contact area between the annular heater 272 and the phase change layer 290, and thus enhances the efficiency of the phase change memory 200.

After forming the phase change layer 290, the top electrode 295 is formed on the phase change memory 290 and in contact with the phase change memory 290, so as to form the phase change memory 200. Furthermore, the photolithography etching technique is applied to pattern the phase change memory 290 and the top electrode 295. In some embodiments, the phase change memory 290 may include one or more phase change material, such as GeSbTe ($Ge_2Sb_2Te_5$, $Ge_3Sb_6Te_5$, GST), nitrogen-doped $Ge_2Sb_2Te_5$, $Sb_2Te$, GeSb or In-doped $Sb_2Te$. In some embodiments, the top electrode 295 is formed of titanium, tantalum nitride, titanium aluminium nitride or titanium aluminium nitride, and the material of the top electrode 195 may be the same as or different from the material of the bottom electrode 140.

Although the present invention has been described in considerable detail with reference to certain embodiments thereof, other embodiments are possible. Therefore, the spirit and scope of the appended claims should not be limited to the description of the embodiments contained herein. Reference will now be made in detail to the embodiments of the invention, examples of which are illustrated in the accompanying drawings. Wherever possible, the same reference numbers are used in the drawings and the description to refer to the same or like parts.

What is claimed is:

1. A method of manufacturing a phase change memory, comprising:
    forming a first mask layer on a dielectric layer;
    forming a second mask layer on the first mask layer;
    patterning the first mask layer and the second mask layer to expose a side surface of the first mask layer;
    removing a portion of the first mask layer from the side surface of the first mask layer to form a columnar protrusion;
    removing the second mask layer;
    forming a heating material layer conformally covering sidewalls and an upper surface of the columnar protrusion; and
    removing the heating material layer on the upper surface of the columnar protrusion to form an annular heater from the heating material layer, and the annular heater surrounding the columnar protrusion.

2. The method of manufacturing the phase change memory of claim 1, further comprising:
    removing the columnar protrusion;
    forming an isolation layer covering the annular heater;
    planarizing the isolation layer to expose the annular heater; and
    forming a phase change layer on the annular heater.

3. The method of manufacturing the phase change memory of claim 1, wherein the portion of the first mask layer is removed from the side surface of the first mask layer by a wet etching process.

4. The method of manufacturing the phase change memory of claim 3, wherein the wet etching process further removes a portion of the second mask layer, and a removal rate of the first mask layer is greater than a removal rate of the second mask layer.

5. The method of manufacturing the phase change memory of claim 1, further comprising forming a barrier layer conformally covering the sidewalls and the upper surface of the columnar protrusion before forming the heating material layer conformally covering the sidewalls and the upper surface of the columnar protrusion.

6. The method of manufacturing the phase change memory of claim 5, wherein the heat material layer and the barrier layer on the upper surface of the columnar protrusion are removed by a dry etching process, and the dry etching process stopping at the columnar protrusion.

7. A method of manufacturing a phase change memory, comprising:
    forming a mask layer on a dielectric layer;
    patterning the mask layer;
    isotropically removing a portion of the mask layer to form a columnar protrusion on the dielectric layer;
    forming a heating material layer conformally covering sidewalls and an upper surface of the columnar protrusion; and
    removing the heating material layer on an upper surface of the columnar protrusion to form an annular heater from the heating material layer, and the annular heater surrounding the columnar protrusion.

8. The method of manufacturing the phase change memory of claim 7, further comprising:
    removing the columnar protrusion;
    forming an isolation layer covering the annular heater;
    planarizing the isolation layer to expose the annular heater, and
    forming a phase change layer on the annular heater.

9. The method of manufacturing the phase change memory of claim 7, wherein the portion of the mask layer is isotropically removed by a wet etching process.

10. The method of manufacturing the phase change memory of claim 7, further comprising forming a barrier layer conformally covering the sidewalls and the upper surface of the columnar protrusion before forming the heating material layer conformally covering the sidewalls and the upper surface of the columnar protrusion.

* * * * *